(12) United States Patent
Yoshida et al.

(10) Patent No.: US 8,405,156 B2
(45) Date of Patent: Mar. 26, 2013

(54) SEMICONDUCTOR DEVICE AND MANUFACTURING METHOD THEREOF

(75) Inventors: Hiroshi Yoshida, Kanagawa (JP); Shuichi Ohya, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 36 days.

(21) Appl. No.: 12/929,900

(22) Filed: Feb. 23, 2011

(65) Prior Publication Data

US 2011/0210399 A1    Sep. 1, 2011

(30) Foreign Application Priority Data

Mar. 1, 2010    (JP) .................................. 2010-044512

(51) Int. Cl.
*H01L 29/76* (2006.01)
*H01L 31/062* (2012.01)
(52) U.S. Cl. ........ 257/374; 257/368; 257/506; 257/510; 438/207; 438/294
(58) Field of Classification Search .................. 257/368, 257/374, 506, 510, 513, E27.062, E21.409; 438/207, 294
See application file for complete search history.

(56) References Cited

U.S. PATENT DOCUMENTS 6,034,393 A * 3/2000 Sakamoto et al. ............ 257/315
7,718,500 B2 * 5/2010 Chong et al. .................. 438/300

FOREIGN PATENT DOCUMENTS

WO    WO 2007/072537 A1    6/2007

* cited by examiner

*Primary Examiner* — Theresa T Doan
(74) *Attorney, Agent, or Firm* — McGinn IP Law Group, PLLC

(57) ABSTRACT

A semiconductor device includes a substrate (e.g., a P-type semiconductor substrate), and an isolation region formed in the substrate to isolate an element formation region from the other region. The semiconductor device also includes a gate electrode formed over the element formation region. The gate electrode extends over each of first and second regions of the isolation region opposing each other with the element formation region interposed therebetween. The semiconductor device further includes a pair of diffusion regions (e.g., N-type diffusion regions) formed in the element formation region so as to be spaced apart from each other in a channel length direction with reference to the gate electrode. At least a portion of each of upper surfaces of the first and second regions is depressed to a depth of not less than 5% of a channel width to be located under an upper surface of the element formation region. In each of resultant depressions also, a portion of the gate electrode is present.

15 Claims, 9 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2010-44512 filed on Mar. 1, 2010 including the specification, drawings and abstract is incorporated herein by reference in its entirety.

BACKGROUND

1. Field of the Invention

The present invention relates to a semiconductor device and a manufacturing method thereof.

2. Description of Related Art

In a semiconductor device having a transistor, isolating an element formation region using an isolation region is commonly practiced. The gate electrode of the transistor is formed so as to pass over the element formation region, and also extends over the isolation region adjacent to the element formation region (see, e.g., International Publication WO 2007/072537 Pamphlet). In a semiconductor device disclosed in International Publication WO 2007/072537 Pamphlet, the upper surface of the element formation region and the upper surface of the isolation region are located in the same plane.

SUMMARY

In a semiconductor device having a transistor, it is important to control the threshold voltage of the transistor to a desired value. However, in the semiconductor device disclosed in International Publication WO 2007/072537 Pamphlet, the threshold voltage varies significantly in response to a variation in the back-gate voltage of the transistor. In other words, the threshold voltage has large dependence on the back-gate voltage.

The present invention provides a semiconductor device, including: a substrate; an isolation region formed in the substrate to isolate an element formation region from the other region; a gate electrode formed over the element formation region to also extend over each of first and second regions of the isolation region opposing each other with the element formation region interposed therebetween; and a pair of diffusion regions formed in the element formation region so as to be spaced apart from each other in a channel length direction with reference to the gate electrode, wherein at least a portion of each of upper surfaces of the first and second regions is depressed to a depth of not less than 5% of a channel width to be located under an upper surface of the element formation region, and a portion of the gate electrode is also present in each of resultant depressions.

In the semiconductor device, the gate electrode is present not only over the element formation region, but also alongside an upper portion of the element formation region. As a result, when a voltage is applied to the gate electrode, an inversion layer (channel region) and a depletion layer extend also from the side surfaces of the upper portion of the element formation region. By the depletion layer, the inversion layer is electrically isolated from the substrate. This allows a reduction in the influence of a back-gate voltage on the inversion layer. Therefore, it is possible to reduce a variation in threshold voltage in response to a variation in the back-gate voltage of the transistor. In other words, the back-gate voltage dependence of the threshold voltage can be reduced.

The present invention also provides a method of manufacturing a semiconductor device, including the steps of: forming an isolation region in a substrate to isolate an element formation region from the other region; forming depressions in respective upper surfaces of first and second regions of the isolation region opposing each other with the element formation region interposed therebetween; forming a gate electrode over the element formation region such that the gate electrode also extends over each of the first and second regions; and forming a pair of diffusion regions in the element formation region such that the pair of diffusion regions are spaced apart from each other in a channel length direction with reference to the gate electrode, wherein, in the step of forming the depressions, each of the depressions is formed to be depressed to a depth of not less than 5% of a channel width, and located under an upper surface of the element formation region, and wherein, in the step of forming the gate electrode, the gate electrode is formed such that a portion thereof is also present in each of the depressions.

According to the present invention, the back-gate voltage dependence of the threshold voltage of the transistor can be reduced.

DESCRIPTION OF THE PREFERRED EMBODIMENTS

Figure 1:
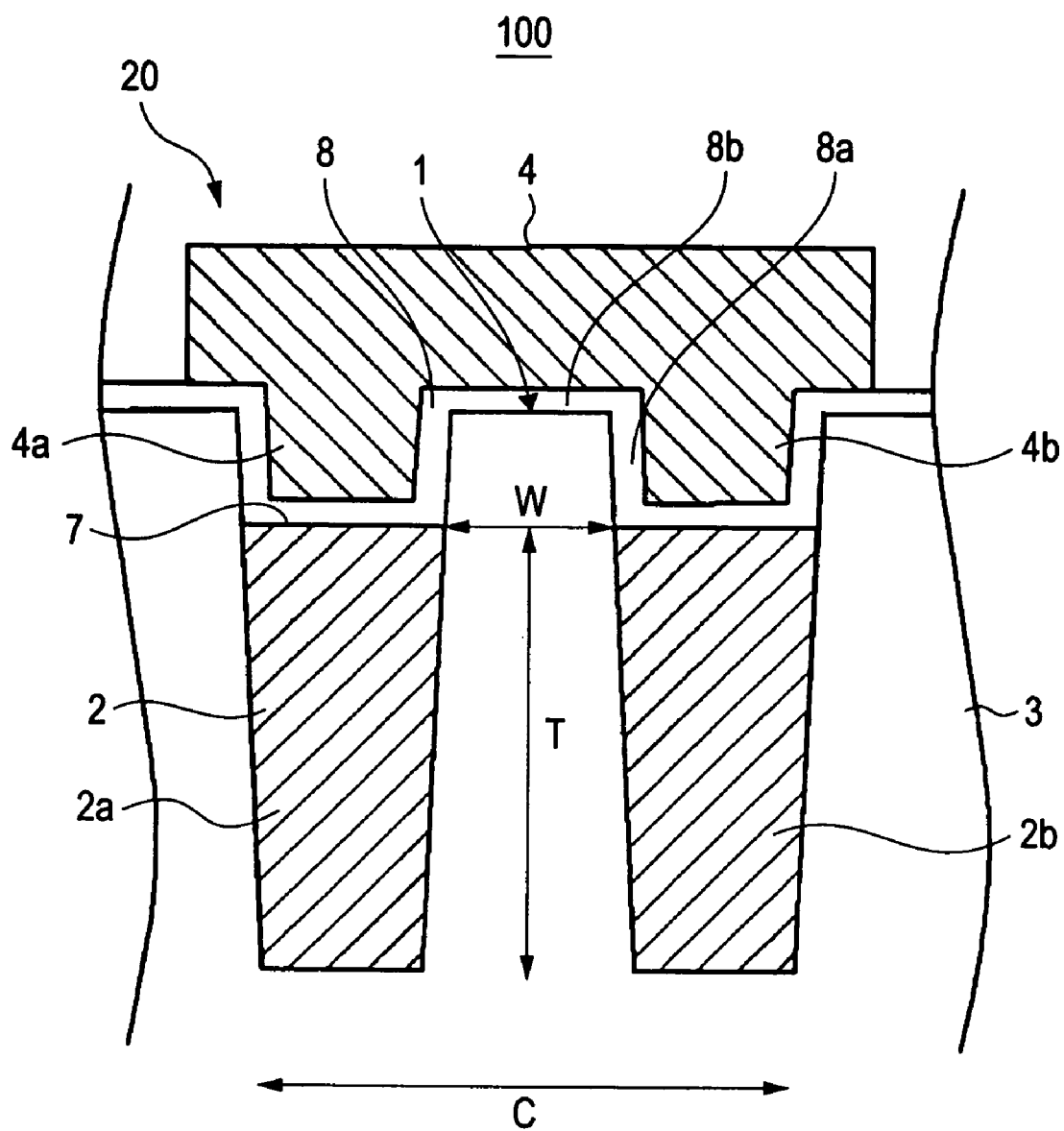
FIG. 1 is a cross-sectional view of a semiconductor device according to an embodiment of the present invention.

An embodiment of the present invention will be described hereinbelow using the drawings of an N-channel MOS transistor. Note that, throughout all the drawings, the same components are designated by the same reference numerals, and a description thereof is omitted as necessary.

Figure 2:
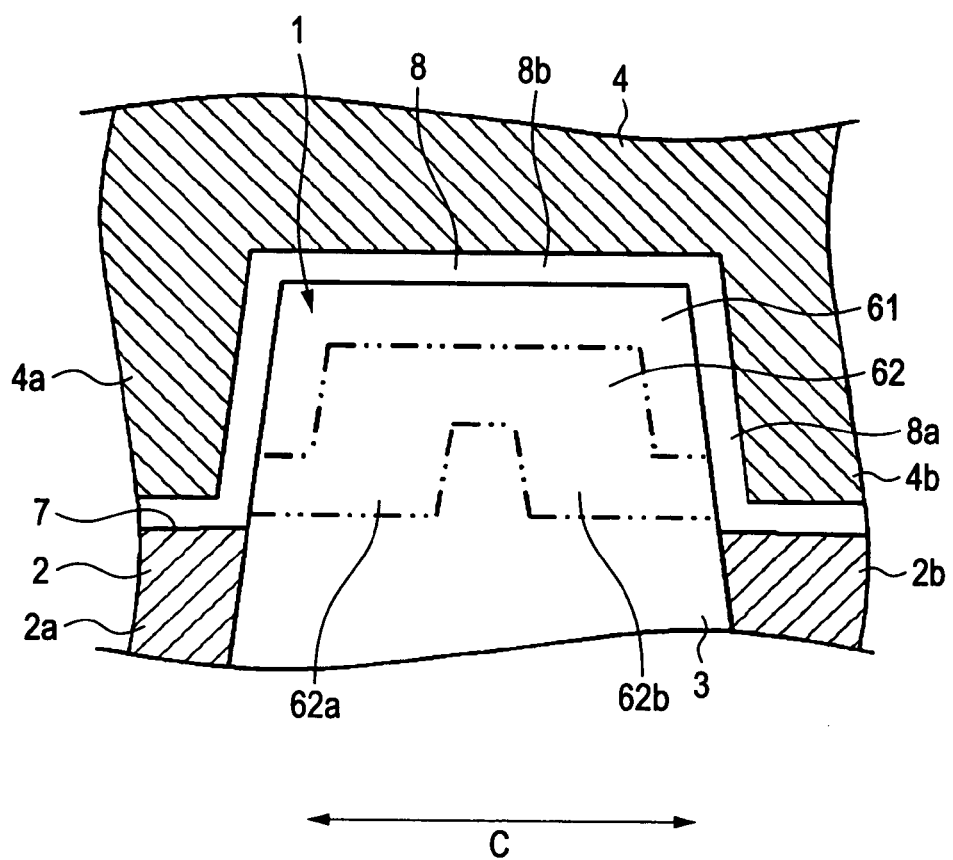
FIG. 2 is a main-portion enlarged view of FIG. 1.
Figure 3:
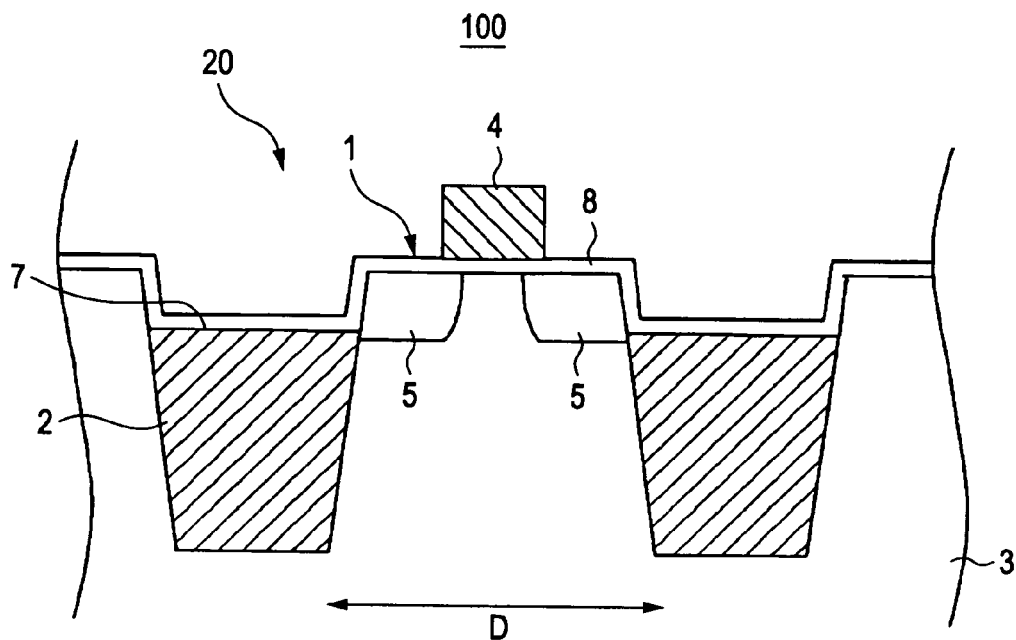
FIG. 3 is a cross-sectional view of the semiconductor device according to the embodiment.
Figure 4:
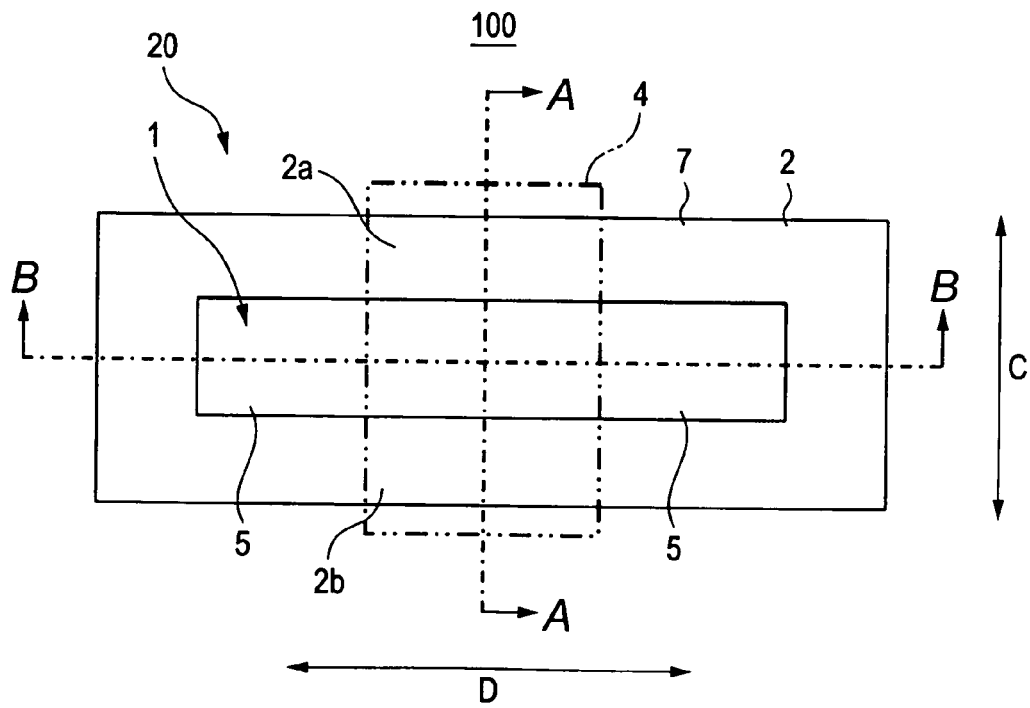
FIG. 4 is a plan view of the semiconductor device according to the embodiment.

FIG. 4 is a plan view of a semiconductor device 100 according to the embodiment. FIG. 1 is a cross-sectional view along the arrow A-A of FIG. 4. FIG. 2 is a main-portion enlarged view of FIG. 1. FIG. 3 is a cross-sectional view along the arrow B-B of FIG. 4.

A semiconductor device 100 according to the present embodiment has a substrate (P-type semiconductor substrate 3), an isolation region 2 for isolating an element formation region 1 formed in the substrate from the other region, a gate electrode 4 formed over the element formation region 1, and a pair of N-type diffusion regions 5 formed in the element formation region 1. The gate electrode 4 also extends over each of first and second regions 2a and 2b of the isolation region 2 opposing each other in a channel width direction C with the element formation region 1 interposed therebetween. The pair of N-type diffusion regions 5 are formed so as to be spaced apart from each other in a channel length direction D (FIGS. 3 and 4) with reference to the gate electrode 4. At least a portion of each of the upper surfaces of the first and second regions 2a and 2b is depressed to a depth of not less than 5% of a channel width W (FIGS. 1 and 2) to be located under the upper surface of the element formation region 1. In each of resultant depressions 7 also, a portion of the gate electrode 4 is present. A detailed description will be given hereinbelow.

As shown in FIG. 4, the isolation region 2 is formed in the P-type semiconductor substrate 3 (hereinafter referred to as the substrate 3: FIGS. 1 and 3) so as to surround the periphery of the element formation region 1. As shown in FIGS. 1 to 3, in the upper surface of the isolation region 2, the depressions 7 are formed. The depressions 7 may be formed appropriately in at least a portion of the upper surface of the first region 2a of the isolation region 2 and in at least a portion of the upper surface of the second region 2b of the isolation region 2. Note that the depressions 7 are preferably formed in the portions of the first and second regions 2a and 2b adjacent to the element formation region 1. The depressions 7 are formed by, e.g., cutting down the entire surface of the isolation region 2.

The depth of each of the depressions 7 is set to be not less than 5% of the channel width W (FIG. 1). The depth of the depression 7 can be set to be, e.g., not less than the channel width W. The depth of the depression 7 can also be set to be, e.g., not less than 50 nm. Alternatively, the depth of the depression 7 can be set to be, e.g., not less than 10% of the thickness T (FIG. 1) of the isolation region 2. For example, each of the depressions 7 is formed to have a flat bottom surface. For example, the depressions 7 are formed in the entire channel width direction C in the first and second regions 2a and 2b. Accordingly, in the channel width direction C, the width of the depression 7 of the first region 2a is generally equal to the width of the first region 2a, and the width of the depression 7 of the second region 2b is generally equal to the width of the second region 2b. Note that the depressions 7 are different from minute depressions formed in the upper surface of the isolation region 2 by a CMP (Chemical Mechanical Polishing) step.

Over the element formation region 1 and the isolation region 2, a gate insulating film 8 is formed. Note that, in FIG. 4, the depiction of the gate insulating film 8 is omitted. Here, of the gate insulating film 8, the portion located along each of the inner side surfaces of the gate electrode 4 is referred to as a side-surface portion 8a, and the portion located along the bottom surface of the gate electrode 4 is referred to as a bottom-surface portion 8b. When the film thickness of the side-surface portion 8b of the gate insulating film 8 is reduced, a breakdown voltage lowers. Therefore, the film thickness of the side-surface portion 8a is preferably set to be at least equal to or more than the film thickness of the bottom-surface portion 8b. However, when the side-surface portion 8a is extremely thick, an effect of reducing the back-gate voltage dependence of the threshold voltage, as will be described later, is reduced. Therefore, the film thickness of the side-surface portion 8a is more preferably set to the same level as that of the bottom-surface portion 8b.

As shown in FIGS. 1 to 4, the gate electrode 4 is provided over the element formation region 1 and the isolation region 2 via the gate insulating film 8. Note that, in FIG. 4, the gate electrode 4 is indicated by the two-dot-dash line. As shown in FIGS. 1 and 2, portions 4a and 4b of the gate electrode 4 are respectively present in the depression 7 of the first region 2a and the depression 7 of the second region 2b.

Thus, in the semiconductor device 100, an N-channel MOS transistor 20 (hereinafter referred to as the transistor 20) is formed which includes the gate electrode 4, the gate insulating film 8, and the pair of N-type diffusion regions 5.

Next, a manufacturing method of the semiconductor device according to the present embodiment will be described. FIGS. 5(a) to 5(f) and 6(a) to 6(f) are a sequence of process step views for illustrating the manufacturing method. FIGS. 5(a), 5(c), and 5(e) and FIGS. 6(a), 6(c), and 6(e) are cross-sectional views at positions each corresponding to a cross section along the arrow B-B of FIG. 4. FIGS. 5(b), 5(d), and 5(f) and FIGS. 6(b), 6(d), and 6(f) are cross-sectional views at positions each corresponding to a cross section along the arrow A-A of FIG. 4.

The manufacturing method of the semiconductor device according to the present embodiment has the following process steps. First, the isolation region 2 is formed in the substrate 3 to isolate the element formation region 1 from the other region. Then, the depressions 7 are formed by etching in the respective upper surfaces of the first and second regions 2a and 2b of the isolation region 2 opposing each other in the channel width direction C with the element formation region 1 interposed therebetween. Then, over the element formation region 1, the gate electrode 4 is formed so as to also extend over each of the first and second regions 2a and 2b. Then, in the element formation region 1, the pair of N-type diffusion regions 5 are formed so as to be spaced apart from each other in the channel length direction D with reference to the gate electrode 4. In the step of forming the depressions 7, each of the depressions 7 is formed to be depressed to a depth of not less than 5% of the channel width W, and located under the upper surface of the element formation region 1. In the step of forming the gate electrode 4, the gate electrode 4 is formed such that a portion thereof is also present in each of the depressions 7. A detailed description will be given hereinbelow.

Figure 5A:
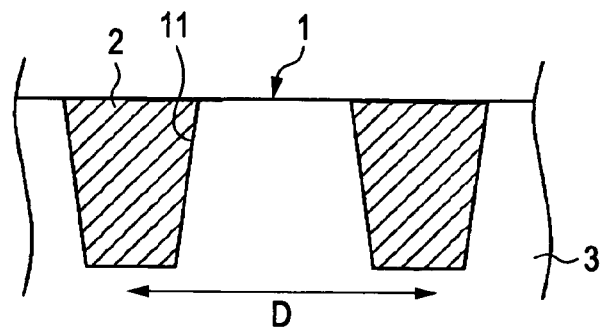
FIGS. 5(a) to 5(f) are cross-sectional views showing a sequence of process steps of a manufacturing method of the semiconductor device according to the embodiment.
Figure 5B:
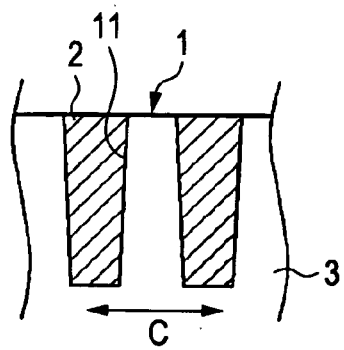

First, as shown in FIGS. 5(a) and 5(b), the isolation region 2 is formed in a surface layer of the substrate 3. For the formation thereof, a mask pattern (the depiction thereof is omitted) is first formed over the portion (element formation region 1) of the substrate 3 other than the portion thereof where the isolation region 2 is to be formed. Then, using the mask pattern as a mask, the surface layer of the substrate 3 is etched. In this manner, the surface layer of the substrate 3 is selectively removed, and trenches 11 for forming the isolation region 2 are formed. Then, an oxide film ($SiO_2$) is formed over the surface of the substrate 3 so as to fill the trenches 11. Then, the surface of the substrate 3 is polished to leave the oxide film in each of the trenches 11, while removing the oxide film from over the substrate 3 except in the trenches 11, thereby forming the isolation region 2.

Figure 5C:
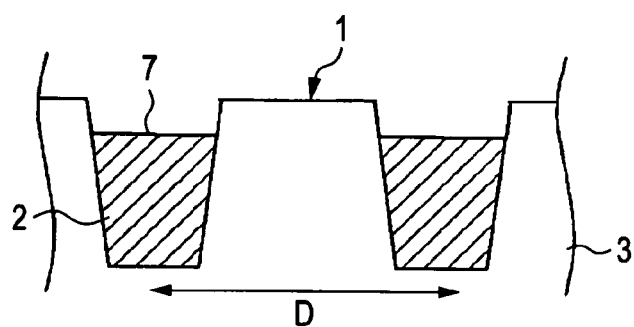
Figure 5D:
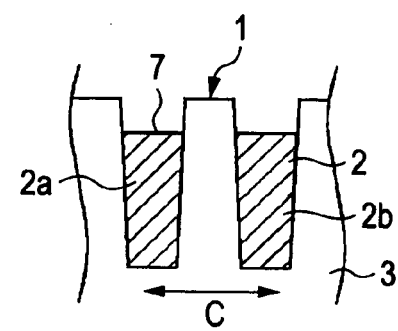

Next, as shown in FIGS. 5(c) and 5(d), the depressions 7 are formed in the isolation region 2. For the formation thereof, the entire surface is subjected to dry etching under etching conditions under which the isolation region 2 is selectively etched or, alternatively, the entire surface is subjected to wet etching. Therefore, in this case, the depression 7 of the first region 2a and the depression of the second region 2b are simultaneously formed.

Figure 5E:
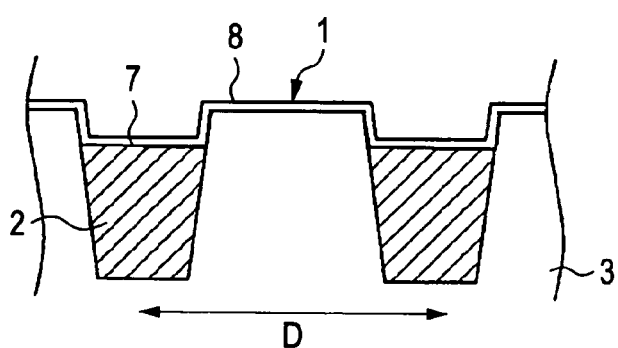
Figure 5F:
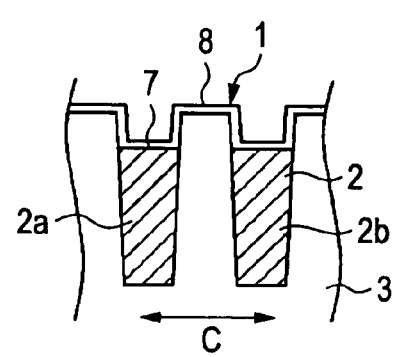

Next, as shown in FIGS. 5(e) and 5(f), the gate insulating film 8 is formed over the element formation region 1 and the isolation region 2. The gate insulating film 8 can be formed by, e.g., CVD (Chemical Vapor Deposition). Note that the gate insulating film 8 can also be formed by thermal oxidation. In this case, however, the gate insulating film 8 is not formed over the isolation region 2.

Figure 6A:
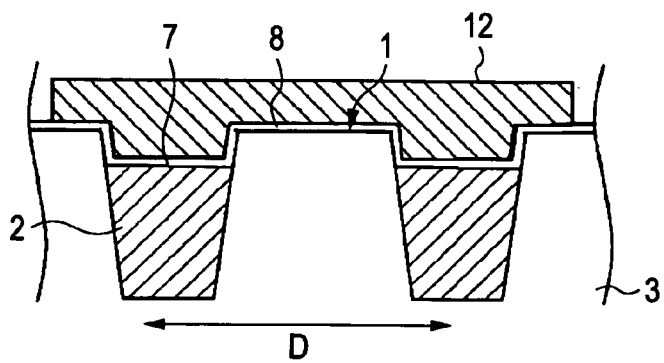
FIGS. 6(a) to 6(f) are cross-sectional views showing a sequence of process steps of the manufacturing method of the semiconductor device according to the embodiment.
Figure 6B:
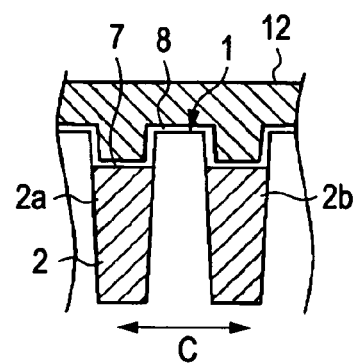

Next, as shown in FIGS. 6(a) and 6(b), a polysilicon film 12 is deposited over the entire surface (over the gate insulating film 8). By the deposition, the polysilicon film 12 is allowed to be present also in the depressions 7.

Figure 6C:
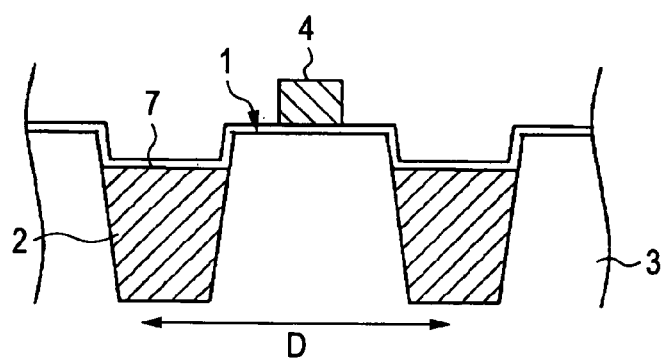
Figure 6D:
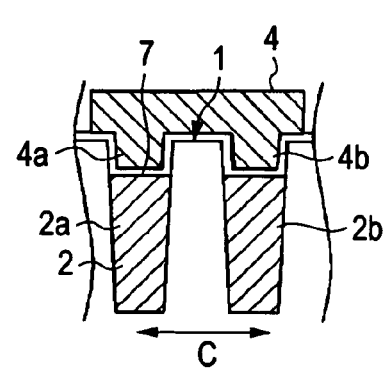

Next, as shown in FIGS. 6(c) and 6(d), the gate electrode 4 is formed over the element formation region 1 and the isolation region 2. For the formation thereof, a mask pattern (the depiction thereof is omitted) is first formed over the portion of the polysilicon film 12 (FIGS. 6(a) and 6(b)) serving as the gate electrode 4. Then, etching using the mask pattern as a mask is performed to process the polysilicon film 12 into the shape of the gate electrode 4. Then, the mask pattern is removed. In this manner, as shown in FIG. 6(d), the gate electrode 4 is formed so as to laterally extend over the upper surface of the element formation region 1 from over the first region 2a to over the second region 2b. In this state, the portion 4a of the gate electrode 4 is present in the depression 7 of the first region 2a, while the portion 4b of the gate electrode 4 is present in the depression 7 of the second region 2b.

Figure 6E:
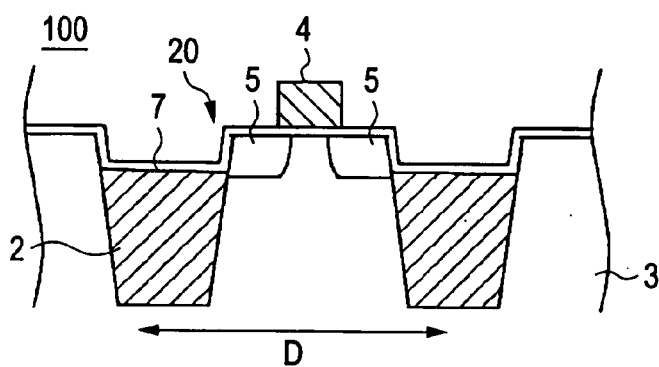
Figure 6F:
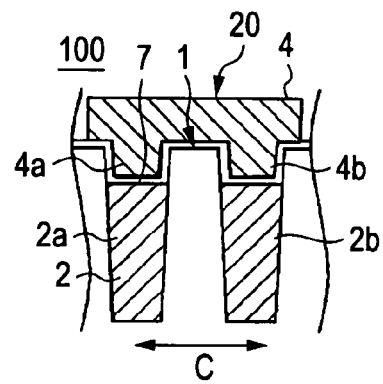

Next, ion implantation of an N-type impurity (e.g., phosphorus) is performed to form the pair of N-type diffusion regions 5 in the element formation region 1, as shown in FIGS. 6(e) and 6(f).

Thereafter, over the substrate 3, a multilevel wiring layer (the depiction thereof is omitted) is formed.

In this manner, the semiconductor device 100 can be manufactured.

Next, an operation will be described.

Figure 7:
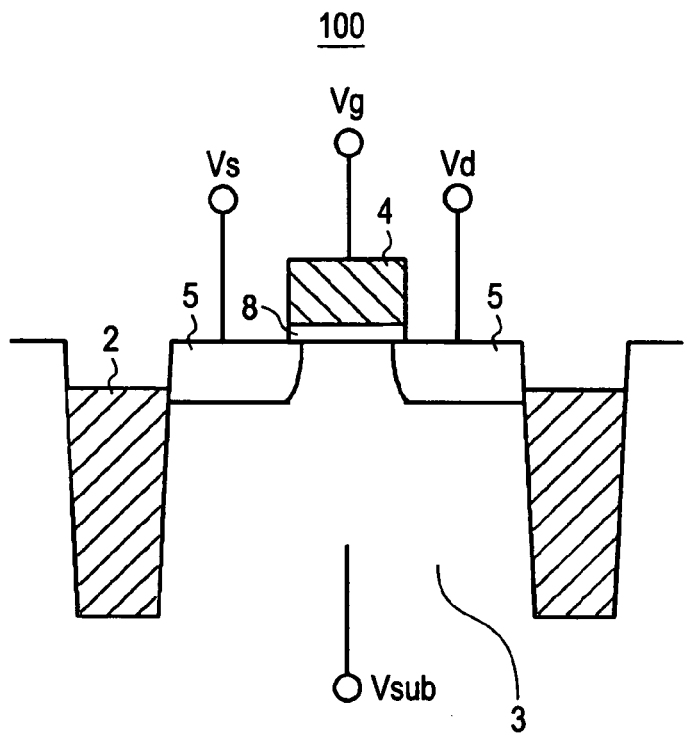
FIG. 7 is a schematic diagram showing a form in which a voltage is applied to the semiconductor device according to the embodiment.

FIG. 7 is a schematic diagram showing a form in which a voltage is applied to the semiconductor device 100 according to the present embodiment.

As shown in FIG. 7, during the operation of the semiconductor substrate 100, a gate voltage Vg, a back-gate voltage Vsub, a source voltage Vs, and a drain voltage Vd are respectively applied to the gate electrode 4, the back surface of the substrate 3, the one of the pair of N-type diffusion regions 5 serving as the source region, and the other N-type diffusion region 5 serving as the drain region.

Figure 8:
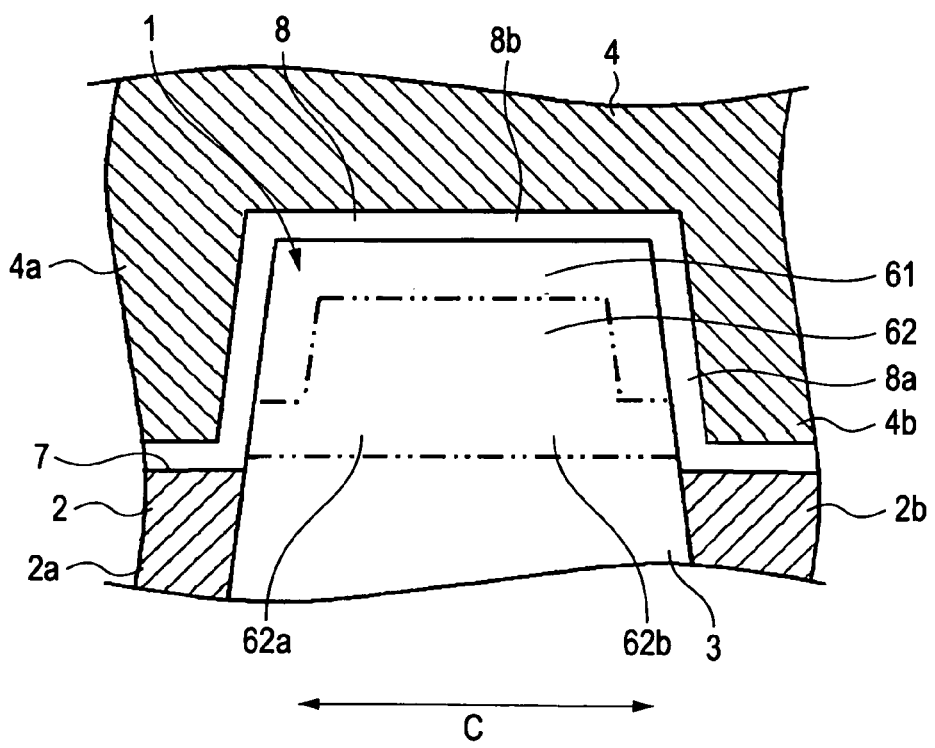
FIG. 8 is a main-portion enlarged view of FIG. 1.

In the semiconductor device 100, the gate electrode 4 is present not only over the element formation region 1, but also alongside an upper portion of the element formation region 1. That is, the portions 4a and 4b of the gate electrode 4 are present alongside the upper portion of the element formation region 1. As a result, when the gate voltage Vg is applied to the gate electrode 4, an inversion layer (channel region) 61 and a depletion layer 62 extend also from the side surfaces of the upper portion of the element formation region 1 inwardly in the channel width direction C, as shown in FIG. 8. By the depletion layer 62, the inversion layer 61 is electrically isolated from the substrate 3 to which the back-gate voltage Vsub is applied. This allows a reduction in the influence of the back-gate voltage Vsub on the inversion layer 61. Therefore, it is possible to reduce the back-gate voltage dependence of the threshold voltage of the transistor 20.

Here, the extent of the depletion layer 62 from the side surfaces of the upper portion of the element formation region 1 is larger in size as the depth of each of the depressions 7 is larger relative to the channel width W.

For example, by setting the depth of the depression 7 at a value of not less than the channel width W, regions 62a and 62b of the depletion layer 62 extending from the both side surfaces of the upper portion of the element formation region 1 are brought in closer contact with each other so that the depletion layer 62 is formed thick under the entire inversion layer 61, as shown in FIG. 8. Therefore, it is possible to further reduce the influence of the back-gate voltage Vsub.

Here, a problem encountered when there is the back-gate potential dependence of the threshold voltage.

Figure 9:
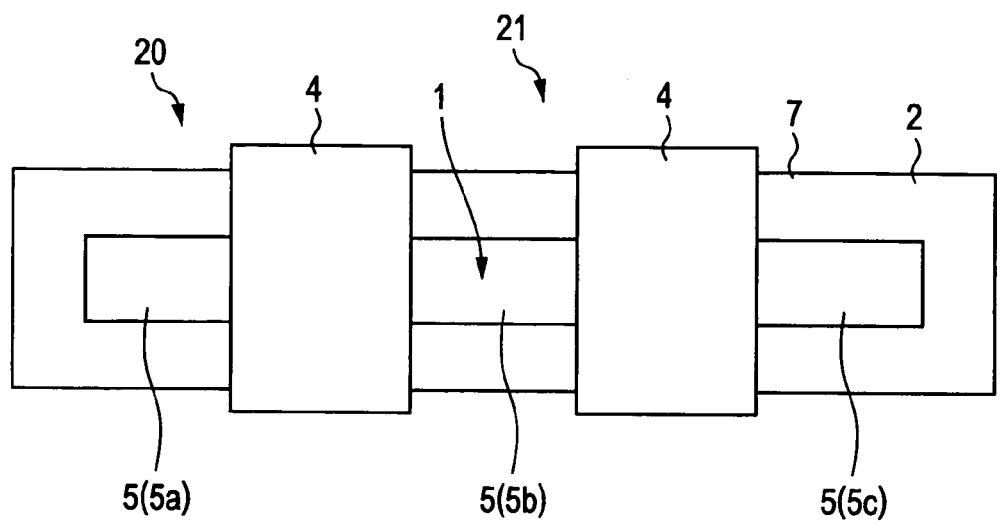
FIG. 9 is a plan view showing two transistors adjacent to each other, and sharing a diffusion region.
Figure 10:
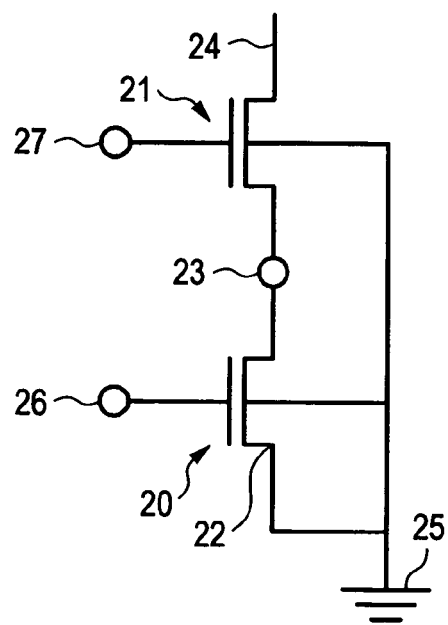
FIG. 10 is an equivalent circuit diagram of the two transistors shown in FIG. 9.
Figure 11:
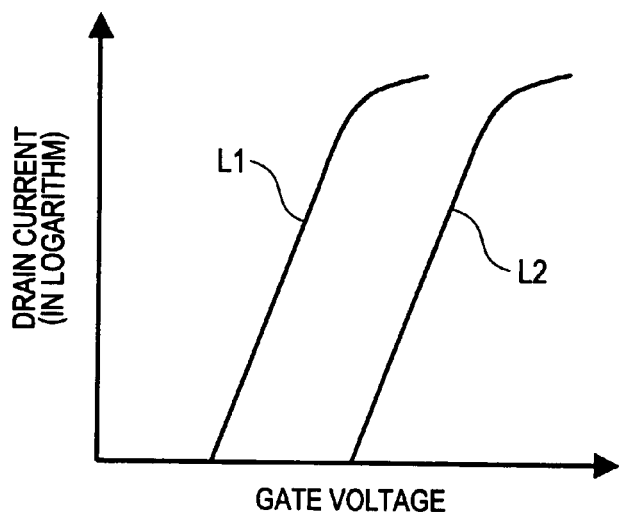
FIG. 11 is a view showing relationships between the gate voltages and drain currents (in logarithm) of the two transistors shown in FIG. 9.

FIG. 9 is a plan view showing two transistors 20 and 21 adjacent to each other, and sharing the N-type diffusion regions 5. FIG. 10 is an equivalent circuit diagram of the two transistors 20 and 21 shown in FIG. 9. FIG. 11 is a view showing relationships between the gate voltages and drain currents (in logarithm) of the transistors 20 and 21. In FIG. 11, the abscissa axis represents a gate voltage, and an ordinate axis represents a drain current (in logarithm). In FIG. 11, the curve L1 shows the relationship between the gate voltage and drain current (in logarithm) of the transistor 20, and the curve L2 shows the relationship between the gate voltage and drain current (in logarithm) of the transistor 21.

As shown in FIG. 9, the transistors 20 and 21 are each formed in the element formation region 1. The transistor 20 has the configuration described above, and the transistor 21 has the same configuration as that of the transistor 20.

In the transistor 20, the N-type diffusion region 5 (5a) opposite to the transistor 21 with reference to the gate electrode 4 of the transistor 20 serves as the source region, and the N-type diffusion region 5 (5b) closer to the transistor 21 serves as the drain region.

On the other hand, in the transistor 21, the N-type diffusion region 5 (5b) closer to the transistor 20 with reference to the gate electrode 4 of the transistor 21 serves as the source region, and the N-type diffusion region 5 (5c) opposite to the transistor 20 serves as the drain region.

Thus, the two transistors 20 and 21 share the N-type diffusion region 5 (5b) located therebetween.

As shown in FIG. 10, a common back gate 25 is coupled to the back-gate side of each of the two transistors 20 and 21. Since the source of the transistor 20 is coupled to the back gate 25, a source voltage 22 is equal to the voltage (back-gate voltage at a ground potential) of the back gate 25. In addition, the drain voltage of the transistor 20 and the source voltage of the transistor 21, each of which is a voltage 23, are equal to each other. The voltage 23 is higher than the source voltage 22 of the transistor 20, and accordingly higher than the back-gate voltage. Note that the drain voltage 24 of the transistor 21 is higher than the voltage 23.

Thus, the source voltage 22 is equal to the back-gate voltage, while the voltage 23 is higher than the back-gate voltage. Accordingly, as shown in FIG. 11, the threshold voltage of a gate voltage 27 of the transistor 21 is higher than the threshold voltage of a gate voltage 26 of the transistor 20. If the gate voltage 27 becomes extremely high, a low-voltage operation of the transistor 21 becomes difficult.

As the back-gate voltage dependence of the threshold voltages of the transistors 20 and 21 are larger, the threshold voltage of the transistor 21 is higher so that the low-voltage operation of the transistor 21 becomes more difficult.

Note that, in FIGS. 9 to 11, an example is shown in which the two transistors 20 and 21 are formed in so-called vertically stacked relation to share the N-type diffusion region 5 (5b). However, even when three or more transistors are vertically stacked, the same problem occurs.

By contrast, in the present embodiment, as described above, the depletion layer 62 extending from the sides of the upper portion of the element formation region 1 allows a reduction in the influence of the back-gate voltage on the inversion layer 61. As a result, it is possible to reduce the back-gate voltage dependence of the threshold voltages of the transistors 20 and 21, and thereby inhibit an increase in voltage 23 (the source voltage of the transistor 21 and the drain voltage of the transistor 20) relative to the source voltage 22 of the transistor 20. This facilitates the low-voltage operation of the transistor 21.

Figure 12:
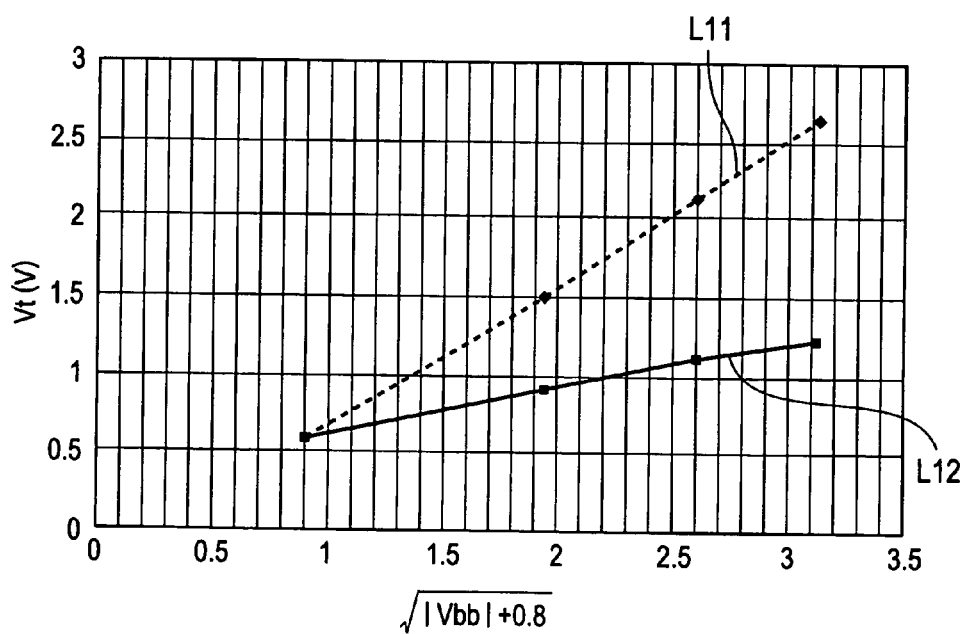
FIG. 12 is a view showing the effect of the semiconductor device according to the embodiment.

FIG. 12 is a view showing the effect of the semiconductor device 100. The abscissa axis of FIG. 12 represents $(|Vbb|+0.8)^{1/2}$, which is a value having positive correlation to the back-gate voltage. The ordinate axis of FIG. 12 represents a threshold voltage (Vt). In FIG. 12, the curve L11 shows a relationship between $(|Vbb|+0.8)^{1/2}$ and the threshold voltage in the semiconductor device having the configuration of International Publication WO 2007/072537 Pamphlet, and the curve L12 shows a relationship between $(|Vbb|+0.8)^{1/2}$ and the threshold voltage in the transistor 20 of the semiconductor device 100 according to the embodiment.

Note that the curve L12 shows the result of simulation when the channel width W of the transistor 20 and the depths of the depressions 7 are assumed to be 50 nm. The curve L11 shows the result of simulation using a transistor (the depiction thereof is omitted) configured similarly to the transistor 20 exhibiting the characteristic of the curve L12 except that the depressions 7 are not formed therein.

As shown in FIG. 12, the transistor 20 according to the present embodiment allows a significant reduction (e.g., 50% or more) in the back-gate voltage dependence of the threshold voltage.

According to an embodiment as described above, the gate electrode 4 is present not only over the element formation region 1, but also alongside the upper portion of the element formation region 1. As a result, when a voltage is applied to the gate electrode 4, the inversion layer (channel region) 61 and the depletion layer 62 also extend from the side surfaces of the upper portion of the element formation region 1 inwardly in the channel width direction C. By the depletion layer 62, the inversion layer 61 is electrically isolated from the back surface of the substrate 3 to which the back-gate voltage is applied. This allows a reduction in the influence of the back-gate voltage on the inversion layer 61. Therefore, it is possible to reduce the back-gate voltage dependence of the threshold voltage of the transistor 20.

<Variation>

Figure 13:
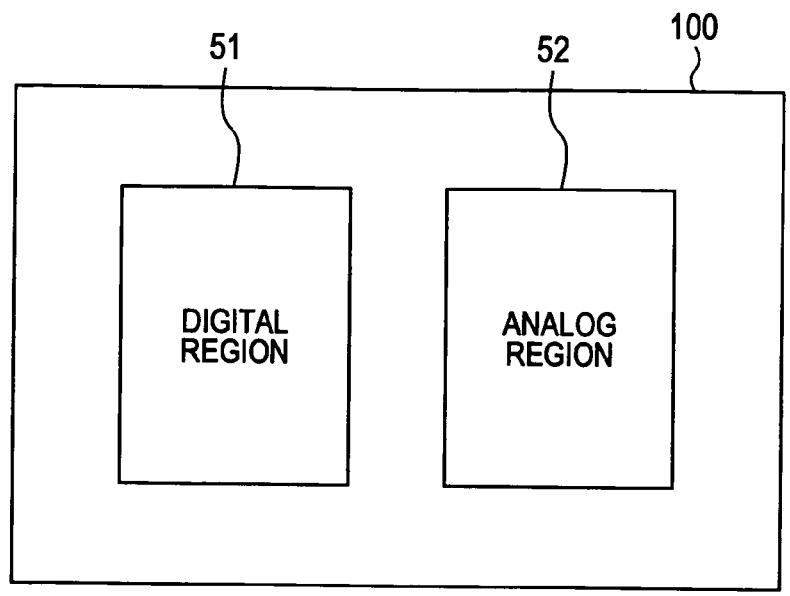
FIG. 13 is a schematic plan view showing a variation of the semiconductor device according to the embodiment.
Figure 14:
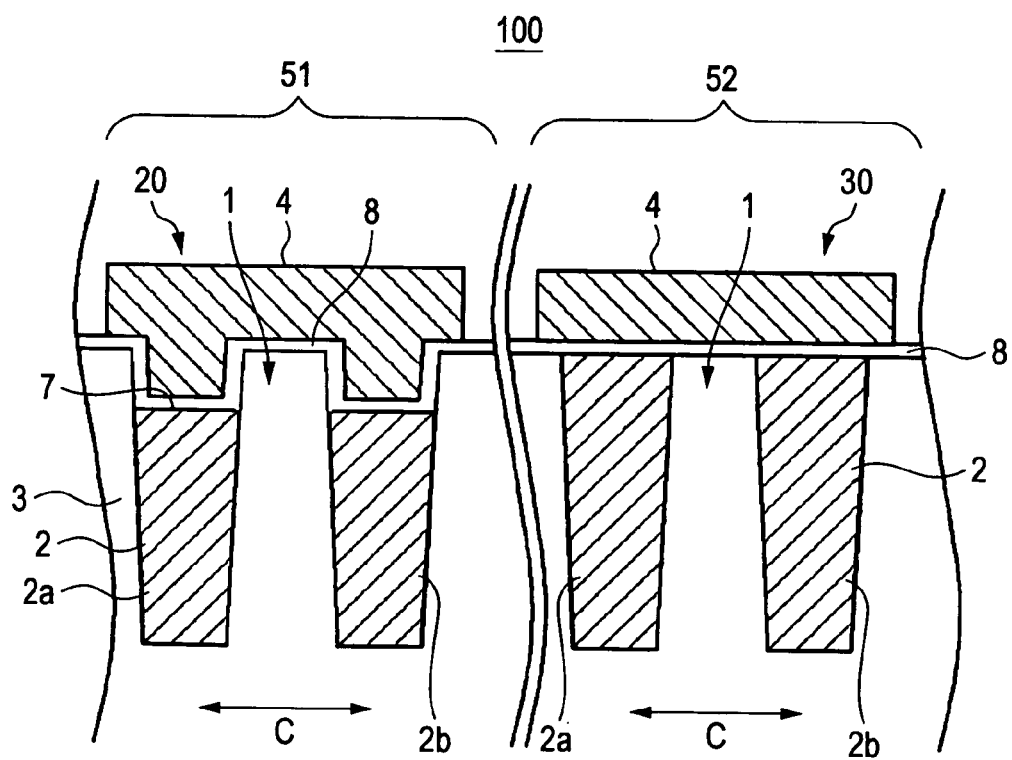
FIG. 14 is a cross-sectional view showing the variation of the semiconductor device according to the embodiment.

FIG. 13 is a schematic plan view showing a variation of the semiconductor device 100 according to the embodiment. FIG. 14 is a cross-sectional view showing the variation of the semiconductor device 100.

The threshold voltage of the transistor 20 described above sensitively varies in response to variations in the depths of the depressions 7 and variations in the channel width W. Therefore, the transistor 20 is preferably applied to a circuit in which the influence of threshold voltage variations is small. Examples of the circuit in which the influence of threshold voltage variations is small, i.e., a circuit to which the transistor 20 is preferably applied include a digital circuit (such as a NOR circuit or a NAND circuit), a DAC (DC-AC converter), and the like. Conversely, examples of a circuit to which the transistor 20 is applied less preferably include an analog circuit which is sensitive to threshold voltage variations.

In the present variation, as shown in FIG. 13, a digital region 51 having a transistor for a digital circuit and an analog region 52 having a transistor for an analog circuit are formed in the same semiconductor device 100 (which is a semiconductor chip in the present embodiment). In this case, as shown in FIG. 14, the transistor 20 described above is formed as the transistor of the digital region 51, and a transistor 30 is formed as the transistor of the analog region 52. The transistor 30 is formed similarly to the transistor 20, except that the isolation region 2 does not have the depressions 7 and the gate electrode 4 is not present in the depressions 7. In other words, the foregoing transistor 20 that has the depressions 7 and the transistor 30 that does not have the depressions 7 are mounted in mixed relation on the same semiconductor chip (semiconductor device 100).

Thus, the semiconductor device 100 of the present variation has a second isolation region (isolation region 2 located around a second element formation region) formed in the substrate 3 to isolate the second element formation region (element formation region 1 on the right-hand side of FIG. 14) from the other region. The semiconductor device 100 also has a second gate electrode (gate electrode 4 on the right-hand side of FIG. 14) formed over the second element formation region to also extend over each of the first and second regions 2a and 2b of the second isolation region opposing each other with the second element formation region interposed therebetween. The semiconductor device 100 further has a pair of second diffusion regions (the same as the pair of N-type diffusion regions 5 in the first embodiment, and the depiction thereof is omitted) formed in the second element formation region so as to be spaced apart from each other in the channel length direction D with reference to the second gate electrode). In the upper surfaces of the first and second regions 2a and 2b of the second isolation region, the depressions 7 are not formed.

According to the present variation, such a configuration inhibits variations in the threshold voltage of the transistor 30 of the analog region 52, while allowing a reduction in the back-gate voltage dependence of the threshold voltage of the transistor 20 of the digital region 51.

Note that, in the foregoing embodiment, an example has been described in which the semiconductor device 100 has the N-channel MOS transistors 20 (21, and 30). However, even when the semiconductor device 100 has P-channel MOS transistors, the same effect as described above can be obtained.

What is claimed is:

1. A semiconductor device, comprising:
a substrate;
an isolation region formed in the substrate to isolate an element formation region from another region;
a gate electrode formed over the element formation region to extend over each of first and second regions of the isolation region opposing each other with the element formation region interposed therebetween; and
a pair of diffusion regions formed in the element formation region so as to be spaced apart from each other in a channel length direction with reference to the gate electrode,
wherein at least a portion of each of upper surfaces of the first and second regions is depressed to a depth of not less than 5% of a channel width to be located under an upper surface of the element formation region, and a portion of the gate electrode is arranged in each of resultant depressions,
wherein the element forming region is arranged, in a first direction, between a first region of the substrate and a second region of the substrate,
wherein the element forming region is arranged, in a second direction, between a third region and a fourth region of the substrate such that the upper surface of the element forming region is higher than an upper surface of the third region and an upper surface of the fourth region, and wherein the element forming region is surrounded by the first region of the substrate, the second region of the substrate, the third region of the substrate, and the fourth region of the substrate in a plane view of the substrate.

2. A semiconductor device according to claim 1, wherein a depth of each of the depressions is not less than the channel width.

3. A semiconductor device according to claim 1, wherein a depth of each of the depressions is not less than 50 nm.

4. A semiconductor device according to claim 1, wherein a depth of each of the depressions is not less than 10% of a thickness of the isolation region.

5. A semiconductor device according to claim 1, wherein each of the depressions comprises a flat bottom surface.

6. A semiconductor device according to claim 1, wherein, in a channel width direction, a width of the depression of the first region of the isolation region is equal to a width of the first region of the isolation region, and a width of the depression of the second region of the isolation region is equal to a width of the second region of the isolation region.

7. A semiconductor device according to claim 1, further comprising:
a second isolation region formed in the substrate to isolate a second element formation region from the another region;
a second gate electrode formed over the second element formation region to extend over each of first and second regions of the second isolation region opposing each other with the second element formation region interposed therebetween; and
a pair of second diffusion regions formed in the second element formation region so as to be spaced apart from each other in the channel length direction with reference to the second gate electrode,
wherein, in upper surfaces of the first and second regions of the second isolation region, the depressions are not formed.

8. A semiconductor device according to claim 1, wherein the isolation region is arranged so as to surround the element formation region in the plane view of the substrate.

9. A semiconductor device according to claim 1, wherein the gate electrode extends over said each of first and second regions of the isolation region opposing each other, in a channel width direction, with the element formation region interposed therebetween.

10. A semiconductor device according to claim 9, wherein said at least said portion of said each of upper surfaces of the first and second regions of the isolation region is depressed to be located under the upper surface of the element formation region so as to form side surfaces of the element formation region.

11. A semiconductor device according to claim 10, wherein the portion of the gate electrode is arranged, through a gate insulating film, in each of the resultant depressions such that a channel forming region is formed in the side surfaces of the element formation region.

12. A semiconductor device, comprising:
a substrate comprising an element forming region such that the element forming region is arranged, in a first direction, between a first region of the substrate and a second region of the substrate,
wherein a upper surface of the element forming region is higher than a upper surface of the first region and a upper surface of the second region such that a first side surface of the element forming region is arranged, in the first direction, between the upper surface of the first region and the upper surface of the element forming region and such that a second side surface of the element forming region is arranged, in the first direction, between the upper surface of the element forming region and the upper surface of the second region;
a gate insulating film extending over the first side surface, the second side surface, and the upper surface of the element forming region;
a gate electrode formed over the element formation region to extend over each of first and second regions,
wherein the gate electrode extends, through the gate insulating film, over the upper surface, the first side surface and the second side surface of the element forming region such that a channel forming region is formed in the first side surface and the second side surface of the element forming region; and
a pair of diffusion regions formed in the element formation region so as to be spaced apart from each other, in a second direction crossing the first direction, with reference to the gate electrode,
wherein the element forming region is arranged, in the second direction, between a third region and a fourth region of the substrate such that the upper surface of the element forming region is higher than a upper surface of the third region and a upper surface of the fourth region, and
wherein the element forming region is surrounded by the first region, the second region, the third region, and the fourth region of the substrate in a plane view of the substrate.

13. A semiconductor device according to claim 12, wherein the upper surface of the element forming region, the upper surface of the first region, and the upper surface of the second region comprise a main surface of the substrate.

14. A semiconductor device according to claim 12, wherein the upper surfaces of the first and the second regions are positioned at a depth of not less than 5% of the channel width to be located under the upper surface of the element formation region.

15. A semiconductor device according to claim 14, wherein the depth is not less than 50 nm.

* * * * *